(12) United States Patent
Kim et al.

(10) Patent No.: US 8,890,589 B2
(45) Date of Patent: Nov. 18, 2014

(54) APPARATUSES FOR MEASURING HIGH SPEED SIGNALS AND METHODS THEREOF

(71) Applicants: Samsung Electronics Co., Ltd., Suwon-Si (KR); Georgia Tech Research Corporation, Atlanta, GA (US)

(72) Inventors: Sung Yeol Kim, Yongin-si (KR); Hyun Woo Choi, Atlanta, GA (US); Nicholas Tzou, Atlanta, GA (US); Xian Wang, Atlanta, GA (US); Thomas Moon, Atlanta, GA (US); Abhijit Chatterjee, Atlanta, GA (US); Ho Sun Yoo, Seongnam-si (KR)

(73) Assignees: Samsung Electronics Co., Ltd. (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/770,337

(22) Filed: Feb. 19, 2013

(65) Prior Publication Data
US 2013/0278295 A1    Oct. 24, 2013

Related U.S. Application Data

(60) Provisional application No. 61/636,825, filed on Apr. 23, 2012.

(51) Int. Cl.
*H03L 7/06* (2006.01)
*H03B 21/00* (2006.01)
*H03M 1/12* (2006.01)

(52) U.S. Cl.
CPC ............ *H03M 1/1245* (2013.01); *H03B 21/00* (2013.01); *H03M 1/121* (2013.01)
USPC ........... 327/156; 327/157; 327/158; 375/371; 375/373; 375/376

(58) Field of Classification Search
USPC ........... 327/156, 157, 158; 375/371, 373, 376
See application file for complete search history.

(56) References Cited

U.S. PATENT DOCUMENTS

2010/0085090 A1* 4/2010 Lin et al. .................... 327/157
2010/0329697 A1* 12/2010 Koizumi et al. ............. 398/208

* cited by examiner

*Primary Examiner* — John Poos
(74) *Attorney, Agent, or Firm* — Harness, Dickey & Pierce, PLC

(57) ABSTRACT

An apparatus for measuring a high speed signal may comprise a plurality of Analog-Digital converters (AD converter) that are arranged in parallel to each other to sample an input signal at different frequencies; a plurality of frequency synthesizers configured to provide each AD converter with a different sampling frequency; a signal processor configured to receive an output of the plurality of AD converters to reconstruct the input signal; and/or a controller configured to receive and process a trigger signal.

19 Claims, 12 Drawing Sheets

APPARATUSES FOR MEASURING HIGH SPEED SIGNALS AND METHODS THEREOF

CROSS-REFERENCE TO RELATED APPLICATION(S)

This application claims priority from U.S. Provisional Application No. 61/636,825, filed on Apr. 23, 2012, in the U.S. Patent and Trademark Office (USPTO), the entire contents of which are incorporated herein by reference.

BACKGROUND

1. Field

Example embodiments may relate to apparatuses for measuring high speed signals, apparatuses capable of measuring and/or analyzing high speed signals, and/or methods thereof.

2. Description of Related Art

In general, in order to measure or analyze a high speed signal, a sample needs to be performed at a sample frequency greater than two times the maximum frequency of a signal to be measured, that is, at or above the Nyquist rate according to the well-known sampling theorem.

However, there is a case that a high speed signal having a frequency exceeding a limit of the sampling frequency of an AD converter (Analog-Digital converter) in use needs to be measured.

If the sampling frequency of the AD converter is increased, such a high speed signal may be measured according to the sampling theorem. However, the implementation of such an AD converter is limited in terms of cost and technical complication.

According to the conventional techniques, in order to measure a high speed signal without increasing the sampling frequency of an AD converter, a Parallel Sampling or Equivalent-time Sampling are employed.

The measurement of a high speed signal based on Parallel Sampling is achieved by use of a plurality of AD converters and a Data Link Layer (DLL) which provides each AD converter with a multiple phase sampling clock.

However, such a Parallel Sampling requires a great number of AD converters and a precise adjustment of a phase difference of sampling clocks.

For the Equivalent-time Sampling, if an input signal is a periodic signal, a delay is given at each sampling period of the input signal to vary the point of time at which a sampling is performed.

Such an Equivalent-time Sampling does not use a great number of AD converters, but requires a precise control of the delay.

Accordingly, there is a need for a method capable of precisely measuring high speed signals with a simple hardware architecture.

SUMMARY

Example embodiments may provide high speed signal measuring apparatuses having multi-rate incoherent sub-sampling hardware architectures, including a plurality of parallel AD converters, which are configured to perform incoherent sampling on input signals at different sampling frequencies by use of the sparsity of the input signals in a frequency domain, and a signal processer, which is configured to reconstruct the sampled signal through a multi-coset signal recovery algorithm or a compressive sampling signal reconstruction algorithm; and/or methods thereof.

In some example embodiments, an apparatus for measuring a high speed signal may comprise a plurality of Analog-Digital converters (AD converter) that are arranged in parallel to each other to sample an input signal at different frequencies; a plurality of frequency synthesizers configured to provide each AD converter with a different sampling frequency; a signal processor configured to receive an output of the plurality of AD converters to reconstruct the input signal; and/or a controller configured to receive and process a trigger signal.

In some example embodiments, the AD converters may perform incoherent sampling on the input signal.

In some example embodiments, each of the frequency synthesizers may comprise a Phase Locked Loop (PLL).

In some example embodiments, the apparatus may further comprise a reference clock distributor configured to provide the plurality of frequency synthesizers with a reference clock.

In some example embodiments, the signal processor may comprise: a multi-coset conversion module configured to merge samples, which are output from the plurality of AD converters, and to convert the merged samples into a plurality of coset samples that each has a sampling period corresponding to a least common multiple of sampling periods of the plurality of AD converters; and/or a signal reconstruction module configured to model a linear equation, which comprises a linear measurement matrix composed of discrete Fourier transform (DFT) basis to reconstruct the input signal from the plurality of coset samples, and to reconstruct the input signal from the linear equation.

In some example embodiments, the linear measurement matrix may comprise a number of rows equal to or greater than a number of columns of the linear measurement matrix.

In some example embodiments, the signal processor may merge samples, which are output from the plurality of AD converters, may model a linear equation configured to reconstruct the input signal from the merged samples by use of a resolution-enhanced discrete Fourier transform (DFT) frame, and/or may reconstruct the input signal from the linear equation by use of Basis Pursuit based on L1 minimization.

In some example embodiments, the controller may determine an active band, on which energy exists, in the input signal. The controller may determine a sampling frequency of one of the plurality of AD converters. The controller may calculate sampling frequencies of remaining AD converters of the plurality of AD converters such that a number of overlaps of the active band is minimized and/or a number of coset samples acquired from the input signal is maximized.

In some example embodiments, a method of measuring a high speed signal by use of a high speed measuring apparatus comprising a plurality of Analog-Digital converters (AD converter) may comprise determining an active band, on which energy exists, in the input signal; determining a sampling frequency of one of the plurality of AD converters; calculating sampling frequencies of remaining AD converters of the plurality of AD converters such that a number of overlaps of the active band is minimized and a number of coset samples acquired from the input signal is maximized; merging samples that are sampled at the determined and calculated sampling frequencies and output by the plurality of AD converters; converting the merged samples into a plurality of coset samples that each has a sampling period corresponding to a least common multiple of sampling periods of the plurality of AD converters; and/or reconstructing the input signal from the plurality of coset samples.

In some example embodiments, in the reconstructing of the input signal from the plurality of coset samples, a linear equation comprising a linear measurement matrix, which is composed of discrete Fourier transform (DFT) basis to reconstruct the input signal from the plurality of coset samples, may be modeled and/or the input signal may be reconstructed from the linear equation.

In some example embodiments, the linear measurement matrix may comprise a number of rows equal to or greater than a number of columns of the linear measurement matrix.

In some example embodiments, a method of measuring a high speed signal by use of a high speed measuring apparatus comprising a plurality of Analog-Digital converters (AD converter) may comprise determining different sampling frequencies of the plurality of AD converters; merging samples that are sampled at the determined sampling frequencies and output by the plurality of AD converters; modeling a linear equation configured to reconstruct an input signal from the merged samples by use of a resolution-enhanced discrete Fourier transform (DFT) frame; and/or reconstructing the input signal from the linear equation by use of Basis Pursuit based on L1 minimization.

In some example embodiments, an apparatus for reconstructing an input signal may comprise a plurality of Analog-Digital converters (AD converter) configured to receive the input signal, to sample the input signal at different frequencies, and to output results of the samples; a plurality of frequency synthesizers configured to provide the AD converters with different sampling frequencies; and/or a signal processor configured to receive the output results of the samples and to reconstruct the input signal.

In some example embodiments, the AD converters may be arranged in parallel.

In some example embodiments, the signal processor may reconstruct the input signal directly from the output results of the samples.

In some example embodiments, the signal processor may convert the output results of the samples to a plurality of coset samples prior to reconstructing the input signal.

In some example embodiments, each of the AD converters may have a different sampling frequency than any other of the AD converters.

In some example embodiments, a number of AD converters may be equal to a number of the frequency synthesizers.

In some example embodiments, each of the frequency synthesizers may be configured to provide one of the sampling frequencies to one of the AD converters.

In some example embodiments, each of the frequency synthesizers may be configured to provide a different one of the sampling frequencies than any other of the frequency synthesizers.

In some example embodiments, the apparatus may further comprise a reference clock distributor configured to provide a reference clock to each of the frequency synthesizers.

In some example embodiments, the apparatus may further comprise a reference clock distributor configured to provide a same reference clock to each of the frequency synthesizers.

In some example embodiments, the apparatus may further comprise a controller configured to determine the different sampling frequencies.

In some example embodiments, the apparatus may further comprise a controller configured to determine a first sampling frequency associated with a first of the AD converters, and/or to determine a second sampling frequency associated with a second of the AD converters based on the first sampling frequency.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
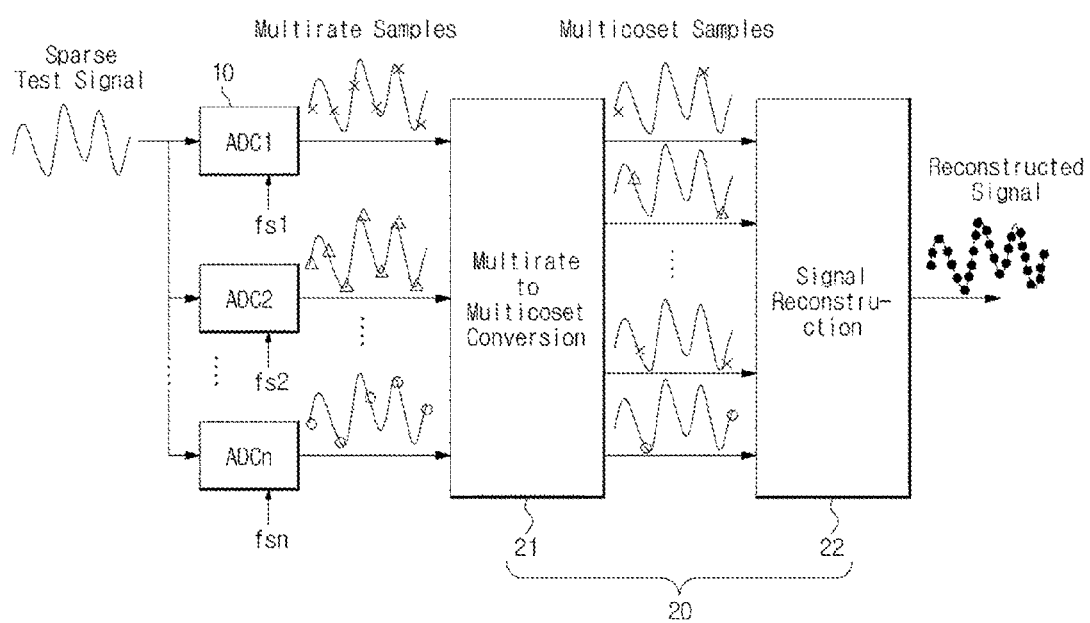
FIG. 1 is a block diagram illustrating the configuration of a high speed signal measuring apparatus according to some example embodiments of the present disclosure.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
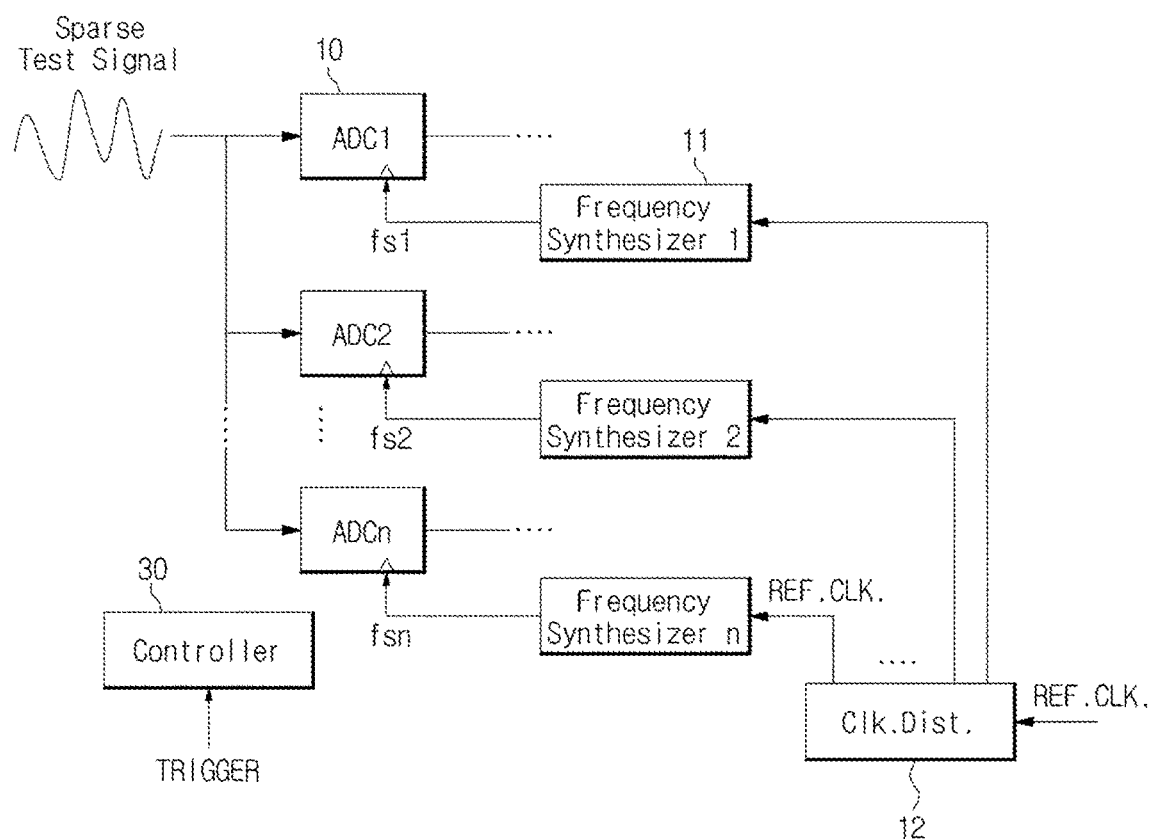
FIG. 2 is a view illustrating an AD converter of the high speed signal measuring apparatus according to some example embodiments of the present disclosure.

FIG. 1 is a block diagram illustrating the configuration of a high speed signal measuring apparatus according to some example embodiments of the present disclosure. FIG. 2 is a view illustrating an AD converter of the high speed signal measuring apparatus according to some example embodiments of the present disclosure.

A high speed signal measuring apparatus according to some example embodiments of the present disclosure includes an Analog-Digital converter (AD converter) 10 configured to sample a test signal, a signal processor 20 configured to reconstruct the test signal from samples, which are output from the AD converter 10, and a controller 30 configured to control each component of the high speed signal measuring apparatus and receive and process a trigger signal TRIGGER.

The AD converter 10 includes at least two AD converters 10 that may be arranged in parallel to each other to receive a test signal. The test signal may be input to each AD converter 10 through a radio frequency (RF) power divider.

Sampling frequencies of the AD converters 10 arrange in parallel to each other may be set to be different from each other.

That is, the AD converters 10 may receive respective sampling frequencies from a plurality of frequency synthesizers 11 that each generate a different sampling frequency.

The frequency synthesizers 11 may be programmed to make offsets between sampling frequencies, which are to be provided to the plurality of AD converters 10, for multi-rate sampling, thereby providing each AD converter 10 with the different sampling frequencies.

The frequency synthesizer 11 may receive a reference clock REFCLK from a reference clock distributor 12 that is configured to provide a reference clock REFCLK for the sampling frequency generation. The reference clock REFCLK may be provided by a reference clock generator (not shown).

As an example of the frequency synthesizer 11, a Phase Locked Loop (PLL) may be used.

The high speed signal measuring apparatus according to some example embodiments of the present disclosure may perform incoherent sampling of a test signal by varying the sampling frequencies of the AD converts 10 by use of the frequency synthesizer 11.

Such a method may enable multi-rate incoherent sampling on a test signal with less number of AD converters 10, for example, two AD converters, thereby achieving a simpler hardware architecture and enhancing time/frequency resolution.

Figure 3:
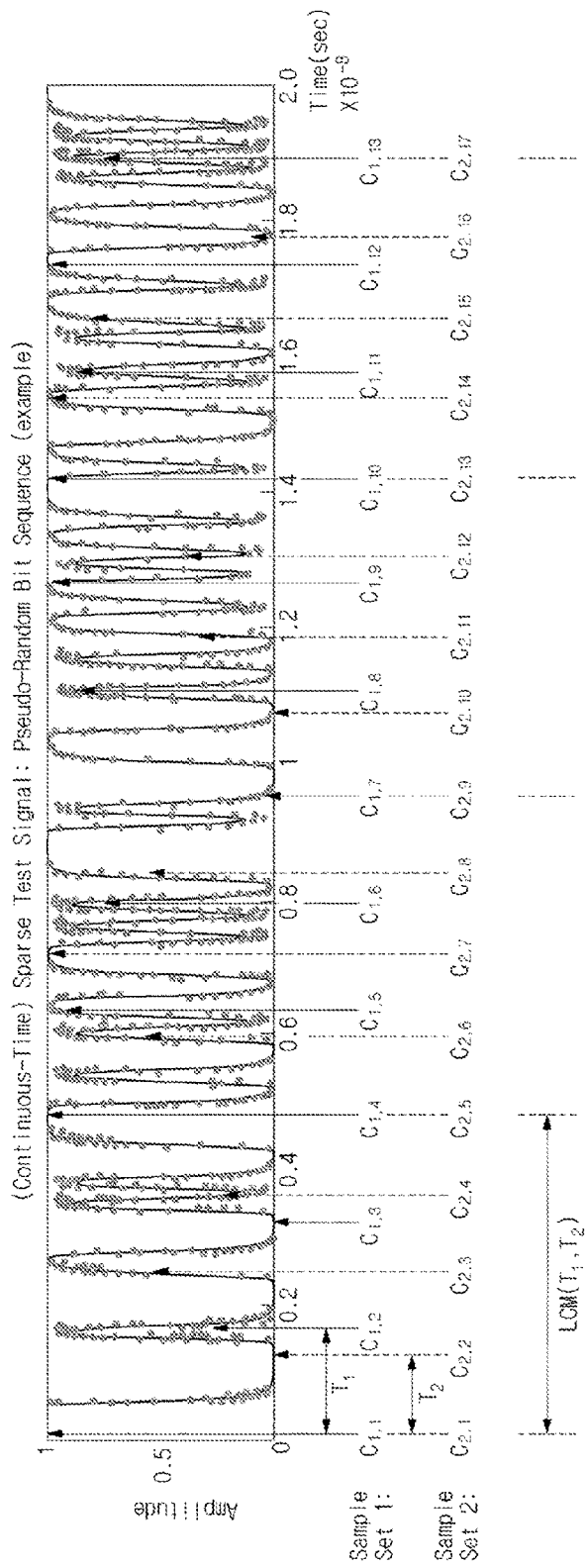
FIG. 3 is a view illustrating a test signal that is sampled by two parallel AD converter having different sampling periods in the high speed signal measuring apparatus according to some example embodiments of the present disclosure.

FIG. 3 is a view illustrating a test signal that is sampled by two parallel AD converters having different sampling periods in the high speed signal measuring apparatus according to some example embodiments of the present disclosure.

Referring to FIG. 3, the test signal is a Sparse test signal having a Frequency Sparsity, for example, the test signal may be implemented by use of Pseudo Random Bit Sequence (PRBS). In FIG. 3, the test signal is shown in a time domain.

A sampling period ($T_1$) of a first AD converter is 4, and a sampling period ($T_2$) of a second AD converter is 3. The sampling frequency is set as an integer for the convenience sake of description. A first frequency synthesizer 11 configured to provide the first AD converter with a sampling period and a second frequency synthesizer 11 configured to provide the second AD converter with a sampling period may be synchronized to t=0.

A sample set output from the first AD converter is denoted as $C_{1,i}$ and a sample set output from the second AD converter is denoted as $C_{2,i}$. Herein, i represents an integer representing the sequence number of the sample.

As shown in FIG. 3, samples, which are merged from sample sets output from the two AD converter 10, may have irregular intervals.

That is, the test signal is sampled by use of the two AD converter 10 having different sampling frequencies, thereby acquiring samples having intervals that are irregular enough to reconstruct the test signal, even though a sampling clock phase is not precisely adjusted and/or a programmable delay device for a random sampling is not used.

In this case, at least two AD converters may be used to acquire a sufficient number of samples needed to reconstruct the test signal by adjusting the sampling frequency of the AD converters without increasing the number of AD converters 10.

A method of determining different sampling frequencies that are provided to a plurality of AD converters, for example, two AD converters 10, will be described in detail later.

The signal processor 20 may reconstruct the test signal from the samples, which are output from the AD converts 10, through digital signal processing (DSP).

The samples output from the AD converters and having irregular intervals may be considered as an example of a multi-coset sampling. Accordingly, the signal processor 20 according to some example embodiments of the present disclosure may reconstruct the signal through a multi-coset signal reconstruction algorithm.

The signal processor 20 may include a multi-coset conversion module 21 and/or a signal reconstruction module 22. The multi-coset conversion module 21 may be configured to convert the samples output from the AD converter 10 to the multi-coset samples. The signal reconstruction module 22 may be configured to reconstruct the test signal from the multi-coset samples.

Figure 4:
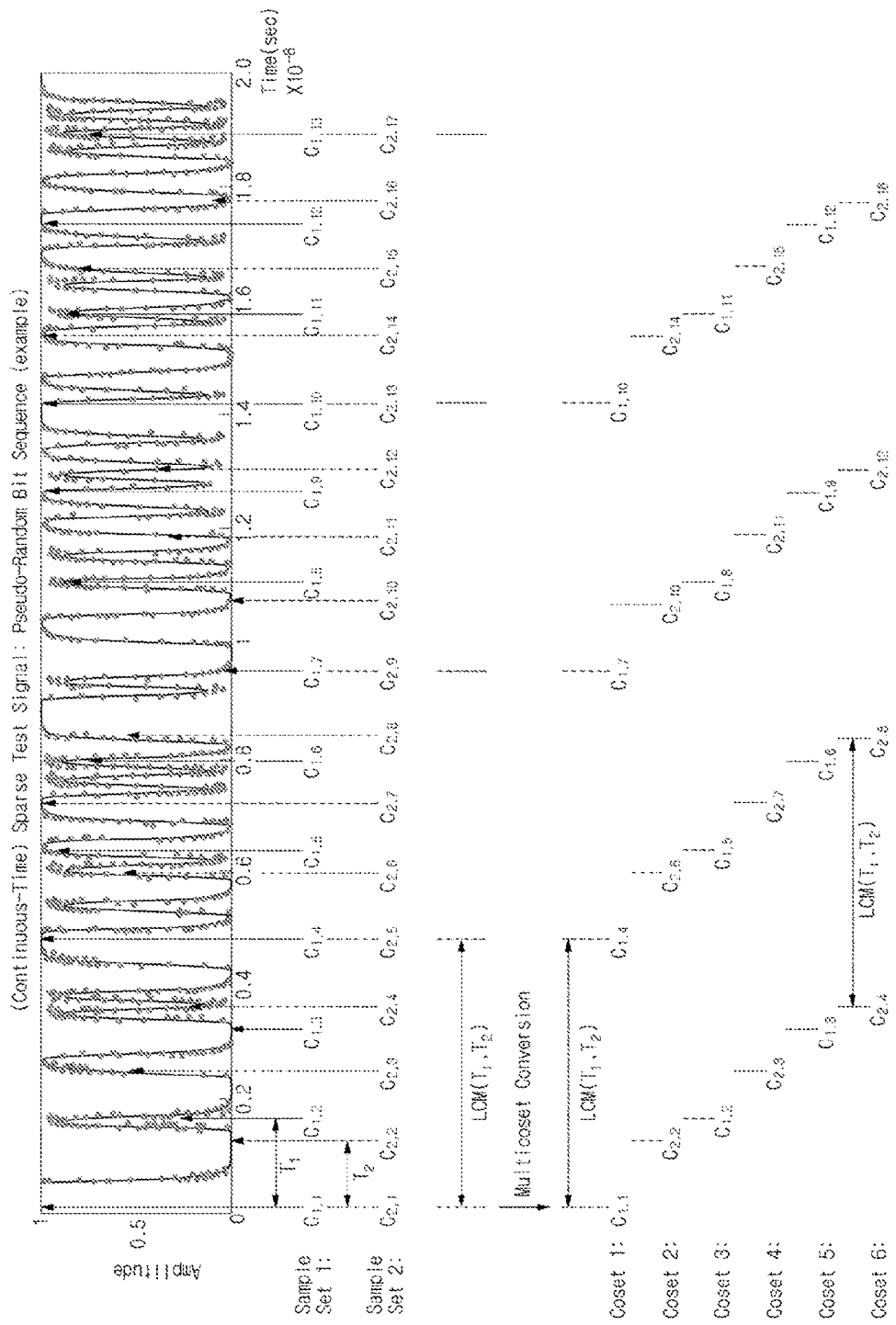
FIG. 4 is a view illustrating an operation in which samples that are output from the AD converter are converted into multi-cosets by a signal processing signal in the high speed signal measuring apparatus according to some example embodiments of the present disclosure.

FIG. 4 is a view illustrating an operation in which samples that are output from the AD converter are converted into a multi-coset by a signal processing signal in the high speed signal measuring apparatus according to some example embodiments of the present disclosure.

Since the multi-coset sampling theorem is generally known in the art, the details thereof will be omitted. Hereinafter, the description will be made in relation to conversion of a signal, which is sampled at different two frequencies, into multi-coset samples.

As described above with reference to FIG. 3, $T_1$ and $T_2$ are referred to as being normalized to an integer from actual sampling periods $t_1$ and $t_2$ of the two AD converters 10. That is, $T_1$ and $T_2$ is a result of normalization by multiplying each of $t_1$ and $t_2$ by a real number R that allows $T_1$ and $T_2$ to become coprime (e.g., prime relative to each other).

In a dual-sampling using the two AD converters 10, the Least Common Multiple (LCM) of the periods $T_1$ and $T_2$ of the AD converters 10 may be referred to as 'L'.

As shown in FIG. 3, when $T_1$ and $T_2$ are 4 and 3, respectively, 'L' is 12. As shown in FIG. 4, a pattern of samples that are output from the two AD converters 10 and merged may be repeated at a period corresponding to the least common multiple L of the $T_1$ and $T_2$, that is, at a period of 12.

According to the dual-sampling using the two AD converters 10, a multi-coset may be generated at a sampling period corresponding to the least common multiple L of the $T_1$ and $T_2$ of each AD converter 10.

The number of cosets existing in a sample set $C_{1,i}$ output from the first AD converter may be calculated as $L/T_1$. Accordingly, the number of cosets existing in $C_{1,i}$ may be three.

The number of cosets existing in a sample set $C_{2,i}$ output from the second AD converter may be calculated as $L/T_2$. Accordingly, the number of cosets existing in $C_{2,i}$ may be four.

Since the sampling periods of the two AD converters 10 may be synchronized to t=0, one of the cosets may be redundant. Accordingly, the total number of cosets generated may be six.

Referring to FIG. 4, the samples output from the two AD converters 10 may be converted to a multi-coset composed of six cosets through the above described process.

The signal reconstruction module 22 may reconstruct the test signal from the multi-coset generated.

A reconstruction equation for reconstructing a multi-coset signal may be modeled to a linear equation (Ax=y) that is expressed in the form of a matrix.

Herein, 'y' may represent a set of a multi-coset and/or may be a vector of P by 1. 'x' may represent a set of signals to be reconstructed and/or may be a vector of Q by 1. 'A' may be a linear measurement matrix and/or may be represented as a P by Q matrix composed of a DFT basis.

The reconstruction of the test signal may be achieved by obtaining 'x' in such a linear system.

The uniqueness of a solution may depend on a rank of the matrix A. If the matrix has a full-column rank, the solution may be unique. Accordingly, only if P is equal to or larger than Q, the unique solution of 'x' may exist. That is, a necessary condition for existence of unique solution may be that P is equal to or larger than Q.

Such a condition may be satisfied by adjusting the sampling frequencies of the two AD converters 10. That is, in a dual sampling system using the two AD converters 10 that sample a test signal at different sampling frequencies, the sampling frequencies of the AD converters 10 may be set such that P, that is, the number of cosets is maximized and Q is minimized.

P may be increased as the interval between different sampling frequencies of the two AD converters 10 becomes narrower. However, the narrowness of the interval between sampling frequencies increases the chance of occurrence of aliasing and thus increases the chance of overlap of an active band. That is, if the interval between the different sampling frequencies becomes narrower, the number of the columns of the linear measurement matrix A may be increased, that is, Q may be increased.

In this case, in order to determine the optimum dual sampling rate, a sparsity factor γ representing a parameter defining the relationship between P and Q is defined.

$$\gamma = Q/P \qquad \text{[Equation 1]}$$

where P represents the number of rows in matrix A;
where Q represents the number of columns in matrix A; and
wherein γ represents the sparsity factor.

The controller 30 may calculate the optimum sampling frequency of the AD converters 10 such that γ is minimized.

The controller 30 may select one of the two AD converters 10, and/or may determine a sampling frequency of the selected AD converter. For example, the maximum sampling frequency allowable for the selected AD converter may be determined to the sampling frequency of the selected AD converter.

If one of the AD converters is determined, the controller 30, while changing the sampling frequency of the other AD converter, may calculate the sparsity factor γ whenever the sampling frequency of the other AD converter is changed.

The optimum frequency of the second AD converter may be determined as a frequency obtained when the sparsity factor γ is minimized.

Figure 5:
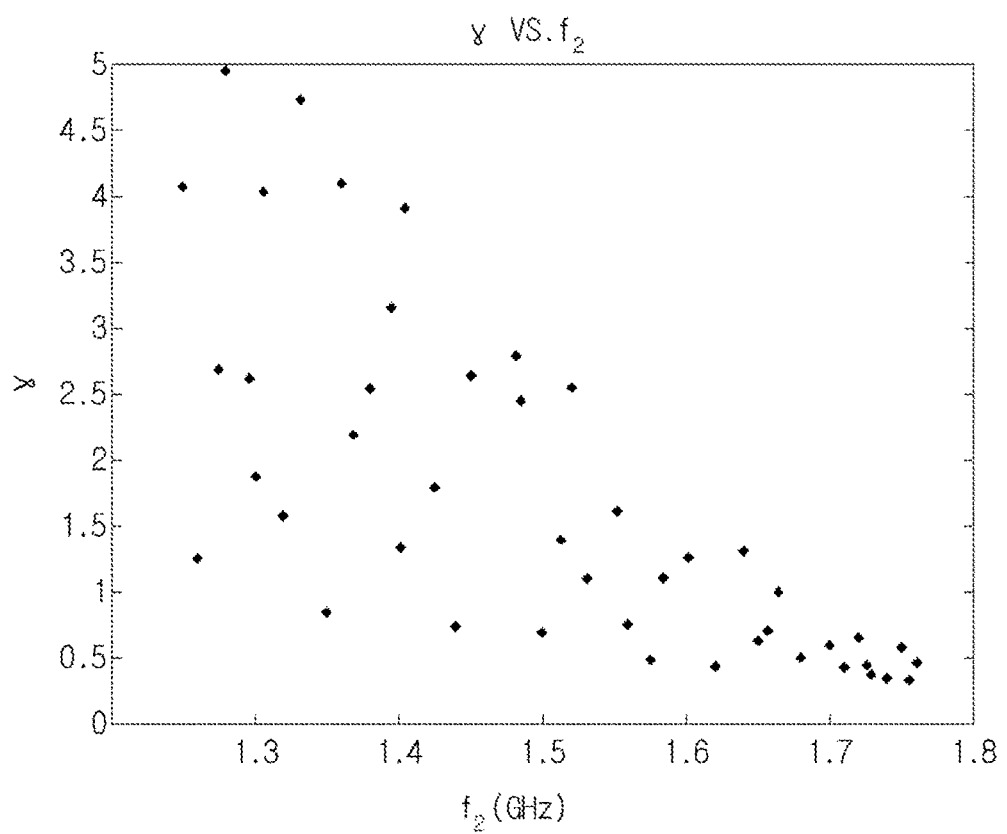
FIG. 5 is a graph showing the relationship between the frequency of the AD converter and the sparsity factor $\gamma$.

FIG. 5 is a graph showing the relationship between the frequency $f_2$ of the second AD converter and the sparsity factor γ.

In a state that the sampling frequency of the first AD converter is fixed at 1.8 GHz, the sparsity factor γ may be plotted varying depending on the change of the sampling frequency of the second AD converter.

Referring to FIG. 5, when the sampling frequency of the second AD converter is approximate to 1.8 GHz, that is, the sampling frequency of the first AD converter, the sparsity factor γ may be smaller. As a calculation, the minimum of the sparsity factor γ is calculated as 0.3333. The optimum sampling frequency of the second AD converter may be determined as 1.755 GHz when the sparsity factor γ is 0.3333.

Figure 6:
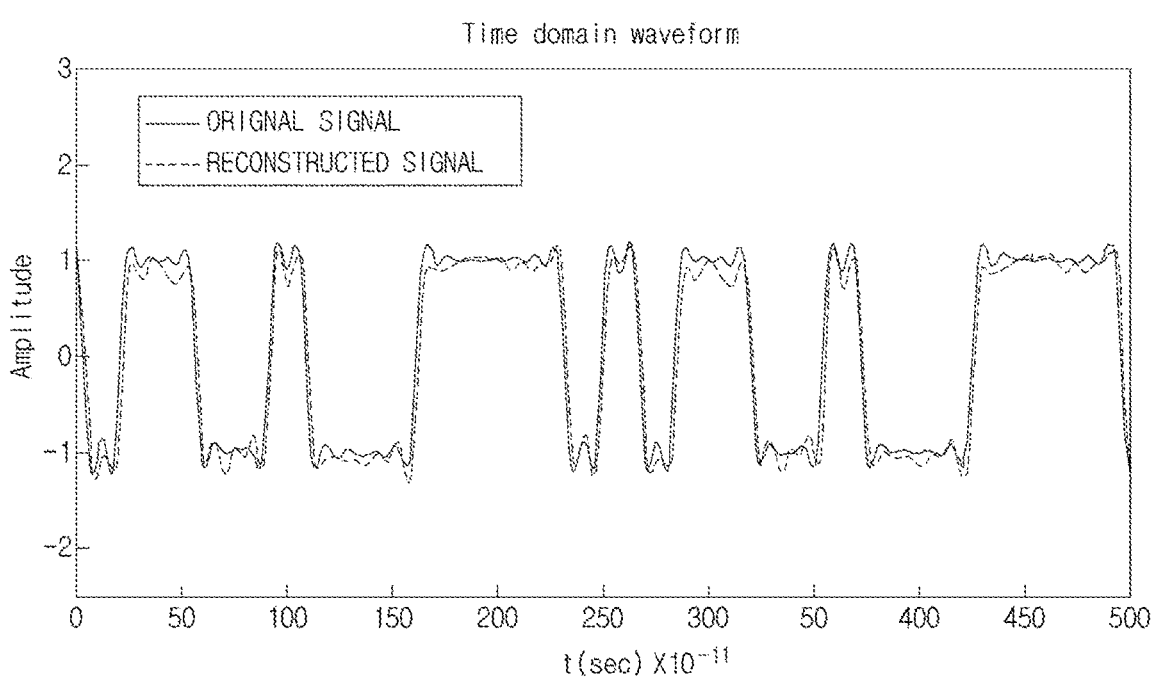
FIG. 6 is a view illustrating a test signal and a reconstructed signal that is reconstructed by the high speed signal measuring apparatus according to some example embodiments of the present disclosure.

FIG. 6 is a view illustrating a test signal and a reconstructed signal that is reconstructed by the high speed signal measuring apparatus according to some example embodiments of the present disclosure.

By sampling PRBS-15 of 4-Gbps serving as a test signal by use of the two AD converters 10 having the sampling frequencies 1.8 GHz and 1.755 GHz, respectively, and performing the above described algorithm, a signal may be reconstructed.

Referring to FIG. 6, a reconstructed signal is approximately matched to the test signal.

Figure 7:
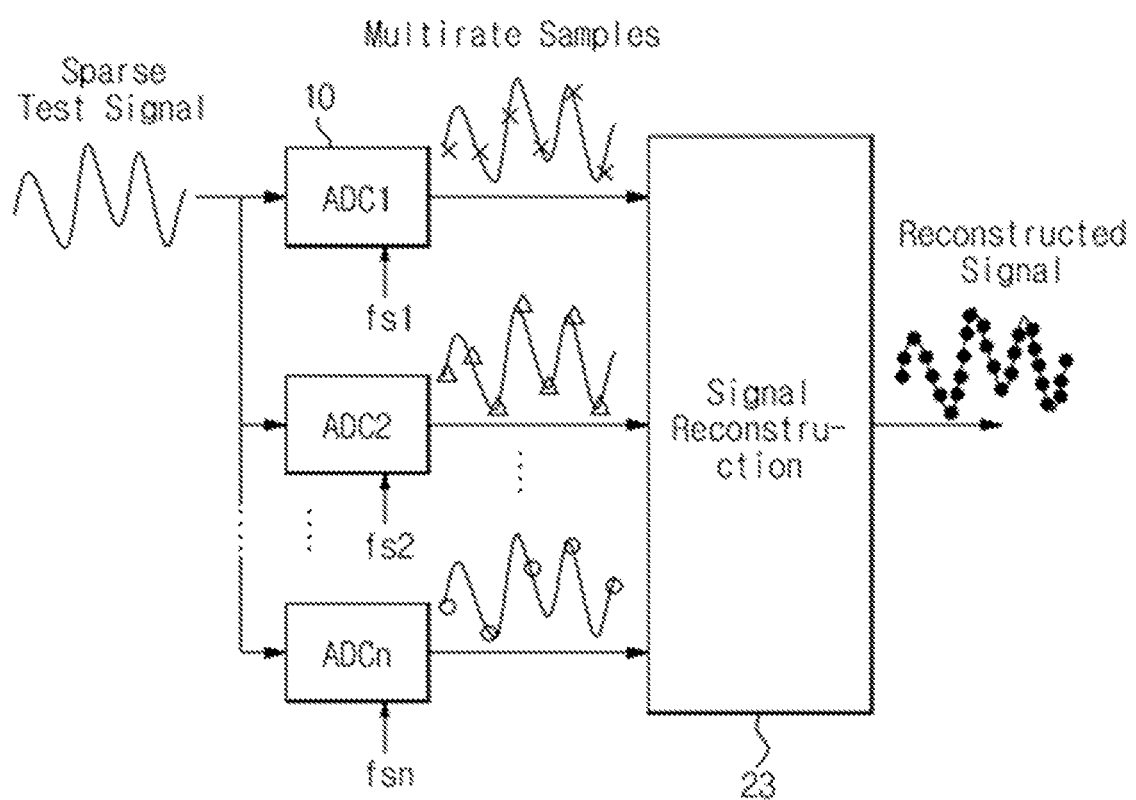
FIG. 7 is a block diagram illustrating the configuration of a high speed signal measuring apparatus according to some example embodiments of the present disclosure.

FIG. 7 is a block diagram illustrating the configuration of a high speed signal measuring apparatus according to some example embodiments of the present disclosure.

A high speed signal measuring apparatus according to some example embodiments of the present disclosure includes the AD converter 10 configured to sample a test signal, a plurality of signal processors 23 configured to reconstruct the test signal from the samples output from the AD converter 10, and/or the controller 30 configured to control each component of the high speed signal measuring apparatus.

Since the AD converter 10 may be identical to that of the high speed signal measuring apparatus of some example embodiments of the present disclosure, the description thereof will be omitted, and detailed description will be made in relation to a test signal reconstruction algorithm of the signal processor 23.

The signal processor 23 may reconstruct a test signal from samples output from the AD converter 10 through DSP.

The signal processor 23 may reconstruct a test signal by use of a spectrum sparse nature of a signal.

In general, when a signal to be processed is converted to a signal in a particular signal space, the converted signal may be referred to as a sparse signal that is mostly zero in value. When the sparse signal is illustrated on x-y graph, the 'y' value of the signal shows zero for the most of the 'x' values and/or non-zero for a relatively small number of the 'x' values.

By using such a sparse signal, an original signal may be reconstructed with a smaller number of linear measurements.

The high speed signal measurement according to some example embodiments of the present disclosure may be achieved through a signal reconstruction algorithm based on a compressive sampling theorem using such a sparsity of signal. Different from the multi-coset signal reconstruction algorithm of some example embodiments of the present disclosure, the signal reconstruction algorithm according to some example embodiments of the present disclosure may directly reconstruct a signal from a sample that is output from a plurality of AD converters arranged in parallel to each other. That is, the process of converting samples output from the AD converters to a multi-coset may be omitted.

First, a reconstruction equation, which is configured to reconstruct a test signal from samples acquired from the two AD converter 10, may be modeled to a linear equation (Ax=y) represented in the form of a matrix.

Herein, 'y' may represent a set of samples, which are acquired by merging sample sets output from the two AD converter 10 and have irregular intervals, and/or may be a vector of m by 1. 'x' may represent a set of signals to be reconstructed, and/or may be a vector of Fourier coefficient of n by 1. 'A' may be a linear measurement matrix and/or may be represented as a m by n matrix composed of a DFT basis. Elements $a_{p,q}$ of the linear measurement matrix may be expressed as equation 2.

$$a_{p,q} = e^{j(q-1)\bar{\omega}t_p}, 1 \leq p \leq m, 1 \leq q \leq n \qquad \text{[Equation 2]}$$

As described above, the present disclosure, which undersamples signals at a sampling frequency lower than Nyquist rate by use of sparsity of signal, may have hardware in which m is smaller than n. In this case, the above linear equation is ill-posed problem, and thus the number of solutions may be infinitely great.

Accordingly, the signal processor 23 according to some example embodiments of the present disclosure may obtain a solution of this ill-posed problem by use of Basis Pursuit based on L1 minimization.

L1 minimization and/or Basis Pursuit are generally known optimization schemes, and detailed description thereof will be omitted. Basis Pursuit is expressed as equation 3.

$$\min_{\tilde{x} \in R^n} \|\tilde{x}\|_{l1}, A\tilde{x} = y \qquad \text{[Equation 3]}$$

$\tilde{x}$ may be obtained by use of Basis Pursuit based on L1 minimization.

However, for incoherent sampling, a spectral leakage may occur on a discrete frequency domain. Since Basis Pursuit exploits sparsity of a test signal on a frequency domain, if a measured tone is not positioned in the middle of DFT bin, the spectral leakage may degrade the measurement performance.

In order to prevent such a measurement performance from being degraded or reduce the associated effect, the signal processer 23 according to some example embodiments of the present disclosure may enhance the resolution in the frequency domain.

That is, the DFT basis of the matrix A is replaced with a 'k' times resolution-enhanced DFT frame, thereby reducing or preventing the degradation of measurement performance. Elements $a_{p,q}$ of the resolution enhanced matrix A is expressed as equation 4.

$$a_{p,q} = e^{j(q-1)\bar{\omega}t_p/k}, 1 \leq p \leq m, 1 \leq q \leq kn \qquad \text{[Equation 4]}$$

A reconstruction equation configured to reconstruct a test signal by reflecting the linear measurement matrix A, which includes the resolution enhanced DFT frame replaced for the DFT basis, may be modeled to A$\tilde{g}$=y. Herein, 'g' may represent a set of signals to be reconstructed, and may be a vector or Fourier coefficient that is related to the resolution enhanced DFT frame.

Similarly, the modeled linear equation may also be an ill-posed problem, so the solution may be obtained by use of Basis Pursuit based on L1 minimization. Basis Pursuit is expressed as equation 5.

$$\min_{\tilde{g} \in R^n} \|\tilde{g}\|_{l1}, A\tilde{g} = y \qquad \text{[Equation 5]}$$

$\tilde{g}$ may be obtained by use of the Basis Pursuit based on L1 minimization.

As described above, if the resolution is enhanced, the difference between the measured tone and the closest DFT bin may be reduced, so that the spectral leakage is reduced. In addition, if the spectral leakage is reduced, the sparsity of the measured signal may be increased.

Basis Pursuit may exploit the sparsity of the signal in obtaining the solution of ill-posed problem. Accordingly, if the sparsity of the measured signal is increased due to the reduction of the spectral leakage, the reconstruction performance of the signal may be improved.

According to some example embodiments of the present disclosure, the spectral leakage that may occur during the incoherent sampling may be reduced or prevented by replacing the DFT basis of the linear measurement matrix A of the reconstruction equation with the k-times resolution-enhanced DFT frame. In addition, since the solution of the ill-posed problem may be obtained by use of Basis Pursuit based on the L1 minimization, the test signal may be reconstructed from the undersampling signal that is sampled at a sampling frequency lower than Nyquist rate.

Figure 8:
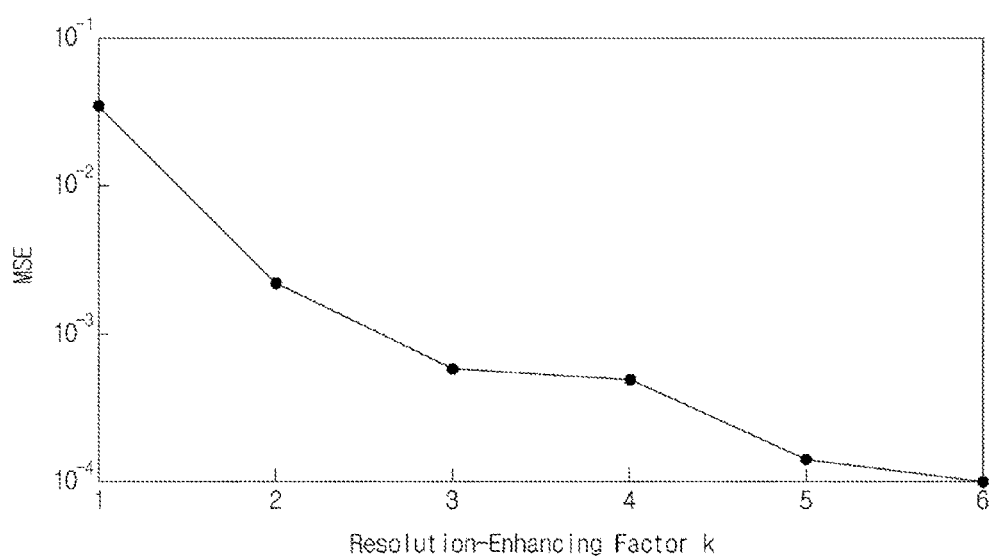
FIG. 8 is a graph showing the relationship between the resolution enhancing factor 'k' and Mean Square Error (MSE) of signal reconstruction in the high speed signal measuring apparatus of FIG. 7.

Referring to FIG. 8, the Mean Square Error (MSE) of the signal reconstruction may be reduced as 'k', that is, the resolution enhancing factor may be increased.

Figure 9:
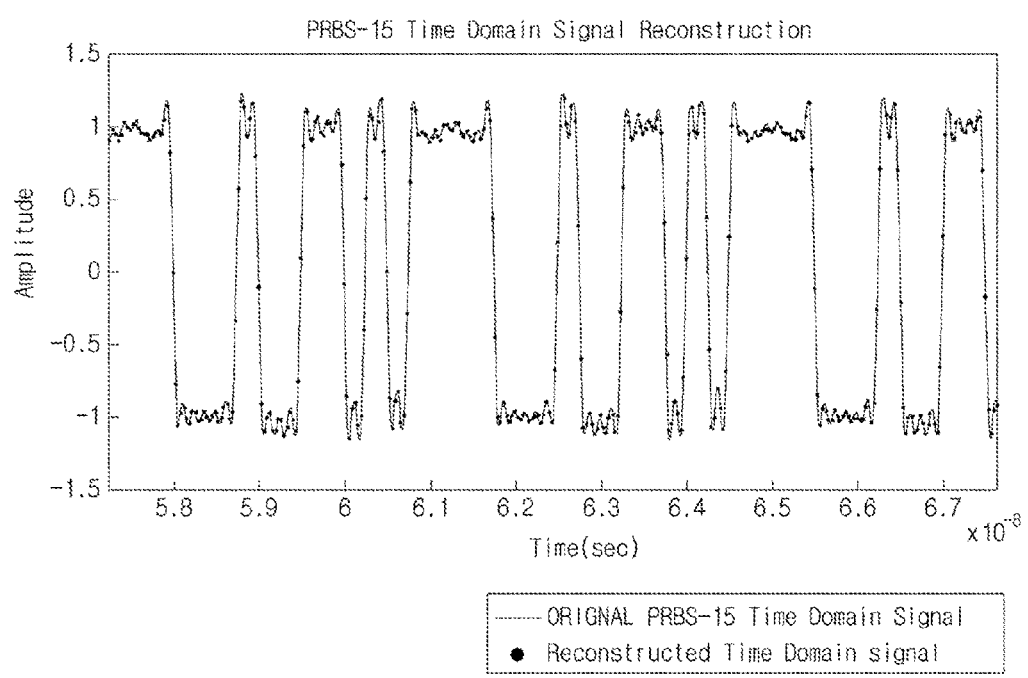
FIG. 9 is a view illustrating a test signal and a reconstructed signal, which is reconstructed by the high speed signal measuring apparatus of FIG. 7, in a time domain.
Figure 10:
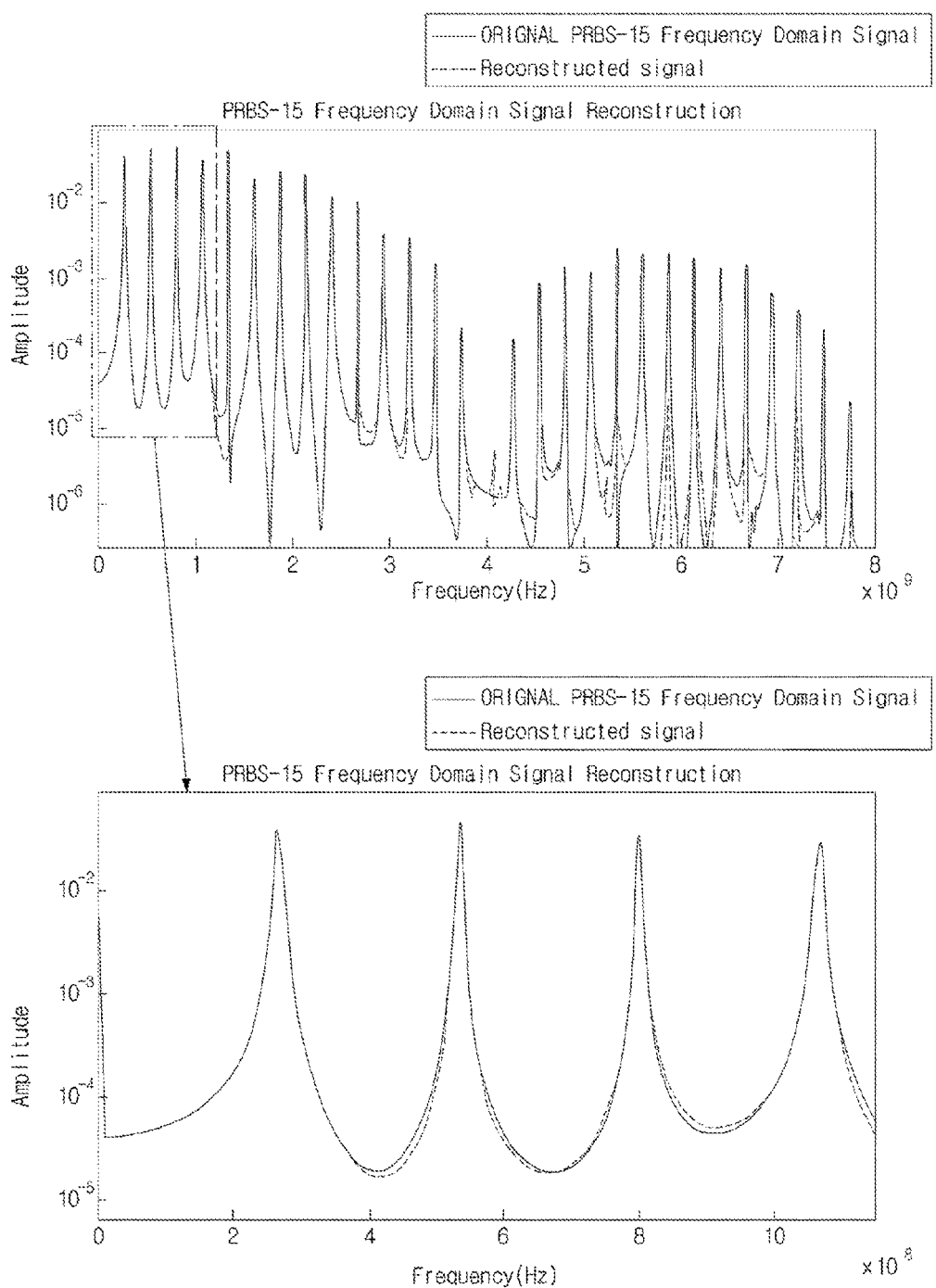
FIG. 10 is a view illustrating a test signal and a reconstructed signal, which is reconstructed by the high speed signal measuring apparatus of FIG. 7, in a frequency domain.

FIG. 9 is a view illustrating a test signal and a reconstructed signal, which may be reconstructed by the high speed signal measuring apparatus of FIG. 7, in a time domain. FIG. 10 is a view illustrating a test signal and a reconstructed signal, which may be reconstructed by the high speed signal measuring apparatus of FIG. 7, in a frequency domain.

A test signal, that is, PRBS-15 of 4-Gbps may be sampled by the two AD converters 10 having the sampling frequencies of 1.8 GHz and 1.7 GHz, respectively, and the signal may be reconstructed through the above algorithm. Basis Pursuit and 5-times resolution-enhanced DFT frame is used for the signal reconstruction. Four hundred incoherent samples, for example, may be used.

Referring to FIGS. 9 and 10, the reconstructed signal is approximately matched to the test signal.

Figure 11:
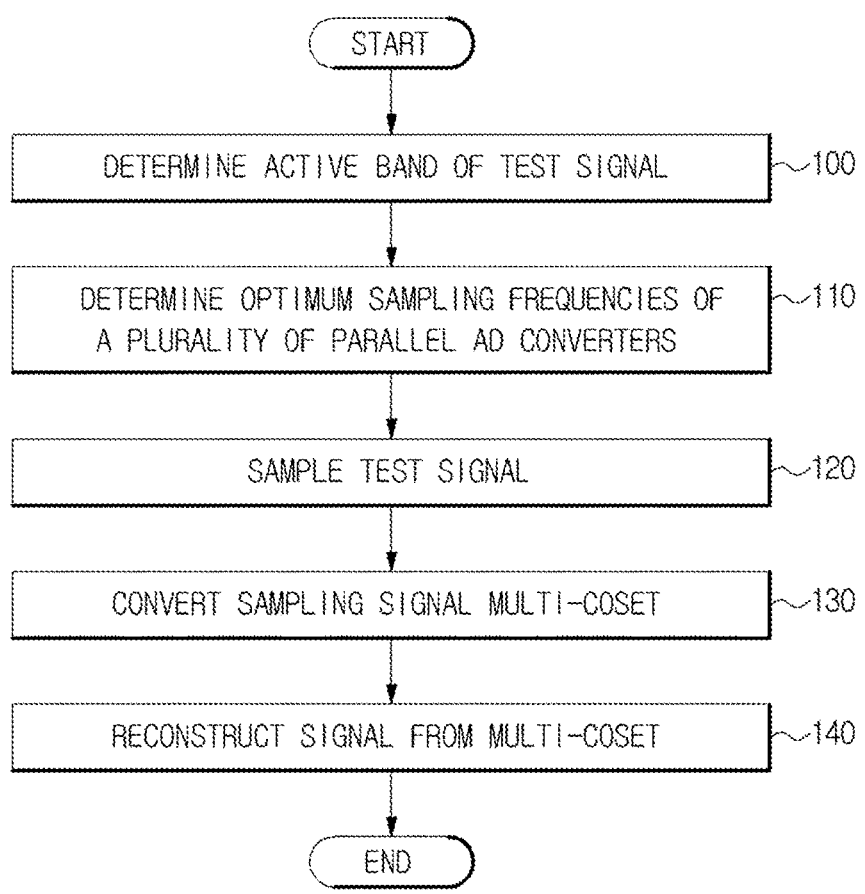
FIGS. 11 and 12 illustrate a flow chart of a method of measuring a high speed signal by use of a high speed signal measuring apparatus according to some example embodiments of the present disclosure.
Figure 12:
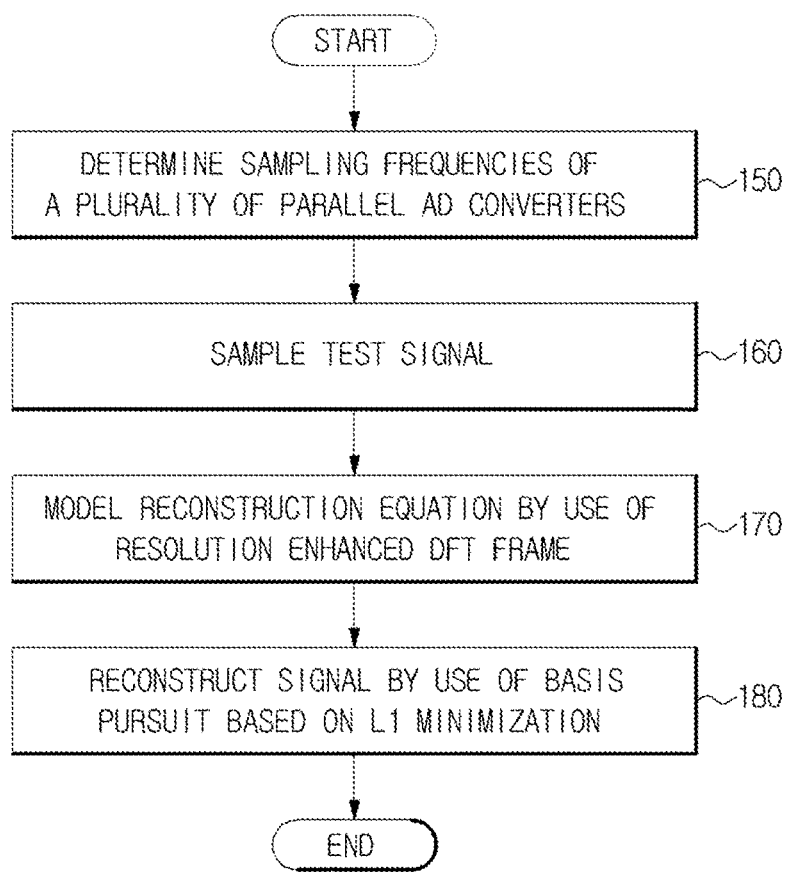

FIGS. 11 and 12 illustrate a flow chart of a method of measuring a high speed signal by use of a high speed signal measuring apparatus according to some example embodiments of the present disclosure.

Referring to FIG. 11, an active band on which energy exists may be determined in a test signal (100). The optimum sampling frequency for each of the plurality of parallel AD converters 10 may be determined (110).

A reconstruction equation for reconstructing a multi-coset signal may be modeled to a linear equation (Ax=y) that is expressed in the form of a matrix. Herein, 'y' may represent a set of a multi-coset and/or may be a vector of P by 1. 'x' may represent a set of signals to be reconstructed and/or may be a vector of Q by 1. 'A' may be a linear measurement matrix and/or may be represented as a P by Q matrix composed of a DFT basis.

The reconstruction of the test signal may be achieved by obtaining 'x' in such a linear system. The uniqueness of a solution may depend on a rank of the matrix A. If the matrix has a full-column rank, the solution may be unique. Accordingly, only if P is equal to or larger than Q, the unique solution of 'x' may exist. That is, a necessary condition for existence of unique solution may be that P is equal to or larger than Q.

Such a condition may be satisfied by adjusting the sampling frequencies of the two AD converters 10. That is, in a dual sampling system using the two AD converters 10 that sample a test signal at different sampling frequencies, the sampling frequencies of the AD converters 10 may be set such that P, that is, the number of cosets may be maximized and/or Q may be minimized.

P may be increased as the interval between different sampling frequencies of the two AD converters 10 becomes narrower. However, the narrowness of the interval between sampling frequencies may increase the chance of occurrence of aliasing and thus may increase the chance of overlap of an active band. That is, if the interval between the different sampling frequencies becomes narrower, the number of the columns of the linear measurement matrix A may be increased, that is, Q may be increased.

In order to determine the optimum dual sampling rate, the controller 30 may calculate the optimum sampling frequency of the AD converters 10 such that a sparsity factor $\gamma$ representing a parameter defining the relationship between P and Q is minimized. The sparsity factor $\gamma$ may be calculated through equation 1.

The controller 30 may select one of the two AD converters 10, and/or may determine the maximum sampling frequency allowable for the selected AD converter. If one of the AD converters is determined, the controller 30, while changing the sampling frequency of the other AD converter, may calculate the sparsity factor $\gamma$ whenever the sampling frequency of the other AD converter is changed.

The optimum frequency of the second AD converter may be determined as a frequency obtained when the sparsity factor $\gamma$ is minimized.

In this manner, the sampling frequencies of the two AD converters 10 may be determined, the AD converters 10 may sample the test signal (120). The signal processer 20 may merge samples output from the AD converters 10 and/or may convert the merged samples into a plurality of coset samples that each may have a sampling period corresponding to the least common multiple of the sampling periods of the plurality of parallel AD converters 10 (130).

$T_1$ and $T_2$ which are referred to as being normalized to an integer from actual sampling periods $t_1$ and $t_2$ of the two AD converters 10 may be determined. That is, $T_1$ and $T_2$ is a result of normalization by multiplying each of $t_1$ and $t_2$ by a real number R that allows $T_1$ and $T_2$ to become coprime.

The Least Common Multiple (LCM) of the periods $T_1$ and $T_2$ of the AD converters 10 may be calculated and may be referred to as L. As shown in FIG. 3, when $T_1$ and $T_2$ are 4 and 3, respectively, L is 12. As shown in FIG. 4, a pattern of samples that are output from the two AD converters 10 and merged is repeated at a period corresponding to the least common multiple L of the $T_1$ and $T_2$, that is, at a period of 12.

According to the dual-sampling using the two AD converters 10, a multi-coset may be generated at a sampling period corresponding to the least common multiple L of the $T_1$ and $T_2$ of each AD converter 10.

The number of cosets existing in a sample set $C_{1,i}$ output from the first AD converter may be calculated as $L/T_1$. Accordingly, the number of cosets existing in $C_{1,i}$ may be three. The number of cosets existing in a sample set $C_{2,i}$ output from the second AD converter may be calculated as $L/T_2$. Accordingly, the number of cosets existing in $C_{2,i}$ may be four.

Since the sampling periods of the two AD converters 10 may be synchronized to t=0, one of the cosets may be redundant. Accordingly, the total number of cosets generated may be six.

After the sampling signal is converted into coset samples, the signal reconstruction module 22 may reconstruct the test signal from the coset samples (140).

The signal reconstruction module 22 may reconstruct the test signal by obtaining 'x' from a test signal reconstruction equation that is modeled to a linear equation (Ax=y) represented in the form of a matrix.

Referring to FIG. 12, the test signal may be reconstructed directly from the sampling signal by use of a reconstruction algorithm using Basis Pursuit and/or resolution-enhanced DFT frame without the process of converting the sampling signal into the multi-coset.

That is, the sampling frequencies of a plurality of AD converters 10, preferably, two AD converters 10 may be determined for the multi-rate incoherent sampling (150), and/or then the test signal may be sampled by the two parallel AD converters 10 (160). The signal processor 23 may merge the samples output from the AD converters 10, and/or may model a linear equation, which is configured to reconstruct the input signal from the merged sample by use of the resolution-enhanced Discrete Fourier Transform frame (170). If the linear equation is modeled, the signal processor 23 may reconstruct the input signal from the linear equation by use of Basis Pursuit based on L1 minimization (180).

The signal processor 23 may use a signal reconstruction algorithm based on a compressive sampling theorem using a sparsity of signal.

A reconstruction equation, which is configured to reconstruct a test signal from samples acquired from the two AD converter 10, may be modeled to a linear equation (Ax=y) represented in the form of a matrix.

Herein, 'y' may represent a set of samples, which are acquired by merging sample sets output from the two AD converter 10 and have irregular intervals, and/or may be a vector of m by 1. 'x' may represent a set of signals to be reconstructed, and/or may be a vector of Fourier coefficient of n by 1. 'A' may be a linear measurement matrix and/or may be represented as a m by n matrix composed of a DFT basis. Elements $a_{p,q}$ of the linear measurement matrix may be expressed as equation 2.

$$a_{p,q}=e^{j(q-1)\bar{\omega}t_p}, 1 \le p \le m, 1 \le q \le n \quad \text{[Equation 2]}$$

As described above, the present disclosure, which undersamples signals at a sampling frequency lower than Nyquist rate by use of sparsity of signal, may have hardware in which 'm' is smaller than 'n'. In this case, the above linear equation is ill-posed problem, and thus the number of solutions may be infinitely great.

Accordingly, the signal processor 23 may obtain a solution of this ill-posed problem by use of Basis Pursuit based on L1 minimization. Basis Pursuit based on L1 minimization is generally known optimization scheme, and detailed description thereof will be omitted. Basis Pursuit may be expressed as equation 3.

$$\min_{\tilde{x} \in R^n} \|\tilde{x}\|_{l1}, A\tilde{x} = y \quad \text{[Equation 3]}$$

$\tilde{x}$ may be obtained by use of Basis Pursuit based on L1 minimization.

Meanwhile, for incoherent sampling, spectral leakage may occur on a discrete frequency domain. Since Basis Pursuit may exploit Sparsity of a test signal on a frequency domain, if a measured tone is not positioned in the middle of DFT bin, the spectral leakage may degrade the measurement performance.

In this regard, the signal processor 23 may enhance the resolution of frequency domain, thereby preventing such a measurement performance from being degraded or reducing the associated effects. That is, the DFT basis of the matrix A may be replaced with a 'k' times resolution-enhanced DFT frame, thereby reducing or preventing the spectral leakage. Elements $a_{p,q}$ of the resolution enhanced matrix A may be expressed as equation 4.

$$a_{p,q}=e^{j(q-1)\bar{\omega}t_p/k}, 1 \le p \le m, 1 \le q \le kn \quad \text{[Equation 4]}$$

A reconstruction equation configured to reconstruct a test signal by reflecting the linear measurement matrix A, which includes the resolution enhanced DFT frame replaced for the DFT basis, may be modeled to Ag=y. Herein, 'g' may represent a set of signals to be reconstructed, and/or may be a vector or Fourier coefficient that is related to the resolution enhanced DFT frame.

Similarly, the modeled linear equation may also be an ill-posed problem, so the solution may be obtained by use of Basis Pursuit based on L1 minimization. Basis Pursuit may be expressed as equation 5.

$$\min_{\tilde{g} \in R^n} \|\tilde{g}\|_{l1}, A\tilde{g} = y \quad \text{[Equation 5]}$$

$\tilde{g}$ may be obtained by use of the Basis Pursuit based on L1 minimization.

As described above, if the resolution is enhanced, the difference between the measured tone and the closest DFT bin may be reduced, so that the spectral leakage may be reduced. In addition, if the spectral leakage is reduced, the sparsity of the measured signal may be increased. Basis Pursuit may exploit the sparsity of the signal in obtaining the solution of an ill-posed problem. Accordingly, if the sparsity of the measured signal is increased due to the reduction of the spectral leakage, the reconstruction performance of the signal may be improved.

While example embodiments have been particularly shown and described, it will be understood by those of ordinary skill in the art that various changes in form and details may be made therein without departing from the spirit and scope of the present invention as defined by the following claims.

What is claimed is:

1. An apparatus for measuring a high speed signal, the apparatus comprising:
   a plurality of Analog-Digital converters (AD converter) that are arranged in parallel to each other to sample an input signal at different frequencies;
   a plurality of frequency synthesizers configured to provide each AD converter with a different sampling frequency;
   a signal processor configured to receive an output of the plurality of AD converters to reconstruct the input signal; and
   a controller configured to receive and process a trigger signal;
   wherein each of the frequency synthesizers is configured to provide one of the sampling frequencies to one of the AD converters.

2. The apparatus of claim 1, wherein the AD converters perform incoherent sampling on the input signal.

3. The apparatus of claim 1, wherein each of the frequency synthesizers comprises a Phase Locked Loop (PLL).

4. The apparatus of claim 1, further comprising a reference clock distributor configured to provide the plurality of frequency synthesizers with a reference clock.

5. The apparatus of claim 1, wherein the signal processor comprises:
   a multi-coset conversion module configured to merge samples, which are output from the plurality of AD converters, and to convert the merged samples into a plurality of coset samples that each has a sampling period corresponding to a least common multiple of sampling periods of the plurality of AD converters; and
   a signal reconstruction module configured to model a linear equation, which comprises a linear measurement matrix composed of discrete Fourier transform (DFT) basis to reconstruct the input signal from the plurality of coset samples, and to reconstruct the input signal from the linear equation.

6. The apparatus of claim 5, wherein the linear measurement matrix comprises a number of rows equal to or greater than a number of columns of the linear measurement matrix.

7. The apparatus of claim 1, wherein the signal processor merges samples, which are output from the plurality of AD converters, models a linear equation configured to reconstruct the input signal from the merged samples by use of a resolution-enhanced discrete Fourier transform (DFT) frame, and reconstructs the input signal from the linear equation by use of Basis Pursuit based on L1 minimization.

8. The apparatus of claim 1, wherein the controller determines an active band, on which energy exists, in the input signal,
wherein the controller determines a sampling frequency of one of the plurality of AD converters, and
wherein the controller calculates sampling frequencies of remaining AD converters of the plurality of AD converters such that a number of overlaps of the active band is minimized and a number of coset samples acquired from the input signal is maximized.

9. A method of measuring a high speed signal by use of a high speed measuring apparatus comprising a plurality of Analog-Digital converters (AD converter), the method comprising:
determining an active band, on which energy exists, in the input signal;
determining a sampling frequency of one of the plurality of AD converters;
calculating sampling frequencies of remaining AD converters of the plurality of AD converters such that a number of overlaps of the active band is minimized and a number of coset samples acquired from the input signal is maximized;
merging samples that are sampled at the determined and calculated sampling frequencies and output by the plurality of AD converters;
converting the merged samples into a plurality of coset samples that each has a sampling period corresponding to a least common multiple of sampling periods of the plurality of AD converters; and
reconstructing the input signal from the plurality of coset samples.

10. The method of claim 9, wherein in the reconstructing of the input signal from the plurality of coset samples, a linear equation comprising a linear measurement matrix, which is composed of discrete Fourier transform (DFT) basis to reconstruct the input signal from the plurality of coset samples, is modeled and the input signal is reconstructed from the linear equation.

11. The method of claim 10, wherein the linear measurement matrix comprises a number of rows equal to or greater than a number of columns of the linear measurement matrix.

12. A method of measuring a high speed signal by use of a high speed measuring apparatus comprising a plurality of Analog-Digital converters (AD converter), the method comprising:
determining different sampling frequencies of the plurality of AD converters;
merging samples that are sampled at the determined sampling frequencies and output by the plurality of AD converters;
modeling a linear equation configured to reconstruct an input signal from the merged samples by use of a resolution-enhanced discrete Fourier transform (DFT) frame; and
reconstructing the input signal from the linear equation by use of Basis Pursuit based on L1 minimization.

13. An apparatus for reconstructing an input signal, the apparatus comprising:
a plurality of Analog-Digital converters (AD converter) configured to receive the input signal, to sample the input signal at different frequencies, and to output results of the samples;
a plurality of frequency synthesizers configured to provide the AD converters with different sampling frequencies; and
a signal processor configured to receive the output results of the samples and to reconstruct the input signal;
wherein each of the frequency synthesizers is configured to provide one of the sampling frequencies to one of the AD converters.

14. The apparatus of claim 13, wherein the AD converters are arranged in parallel, and each of the AD converters has a different sampling frequency than any other of the AD converters.

15. The apparatus of claim 13, wherein the signal processor reconstructs the input signal directly from the output results of the samples or converts the output results of the samples to a plurality of coset samples prior to reconstructing the input signal.

16. The apparatus of claim 13, wherein a number of AD converters is equal to a number of the frequency synthesizers.

17. The apparatus of claim 13, wherein each of the frequency synthesizers is configured to provide a different one of the sampling frequencies than any other of the frequency synthesizers.

18. The apparatus of claim 13, further comprising a reference clock distributor configured to provide a reference clock to each of the frequency synthesizers.

19. The apparatus of claim 13, further comprising a controller configured to determine the different sampling frequencies and determine a first sampling frequency associated with a first of the AD converters, and to determine a second sampling frequency associated with a second of the AD converters based on the first sampling frequency.

* * * * *